United States Patent [19]
Grimes

[11] Patent Number: 5,239,562
[45] Date of Patent: Aug. 24, 1993

[54] MATCHING THE CLOCK PHASE OF DUPLICATED CLOCK CIRCUITS

[75] Inventor: Gary J. Grimes, Thornton, Colo.

[73] Assignee: AT&T Bell Laboratories, Murray Hill, N.J.

[21] Appl. No.: 788,077

[22] Filed: Nov. 5, 1991

[51] Int. Cl.⁵ .............................................. H04L 7/00
[52] U.S. Cl. ..................................... 375/109; 370/103
[58] Field of Search ............... 375/7, 8, 109; 370/109, 370/29, 103, 104.1; 455/75, 76, 79, 88

[56] References Cited

U.S. PATENT DOCUMENTS

| | | | |
|---|---|---|---|
| 3,803,568 | 4/1974 | Higashide | 375/107 |
| 4,494,211 | 1/1985 | Schwartz | 375/109 |
| 5,022,050 | 6/1991 | Tanaka | 375/7 |
| 5,052,028 | 9/1991 | Zwack | 375/109 |

OTHER PUBLICATIONS

R. P. Abbott and D. C. Koehler, *Digital Access and Cross-Connect System-System Architecture*, IEEE National Telecommunications Conference 1981, vol. 1, Nov. 29–Dec. 3, 1981, B1.2.1–B1.2.7.

*Primary Examiner*—Stephen Chin
*Attorney, Agent, or Firm*—John C. Moran

[57] ABSTRACT

An apparatus for duplicated clock circuits using equivalent devices in monolithically package devices and cross-coupling local clock signals of each clock circuit over the appropriate link cables with the other clock circuit. The apparatus distributes the local clock signal to both clock circuits for precise delay compensation. Further, the apparatus utilizes the propagation delay matching of semiconductor devices in the same package on the same monolithic substrate and the matching of interconnection impedances in corresponding devices in different packages to closely match the phase of duplicated clock signals. It further takes advantage of the fact that the locally used clock signals not normally cross-coupled are cross-coupled using cables which are chosen in length to exactly compensate for the actual cross-coupling delays in the cables; and since the routes are chosen to be the same, the temperature variations which cause small differences in propagation speeds through the cables are also compensated.

9 Claims, 3 Drawing Sheets

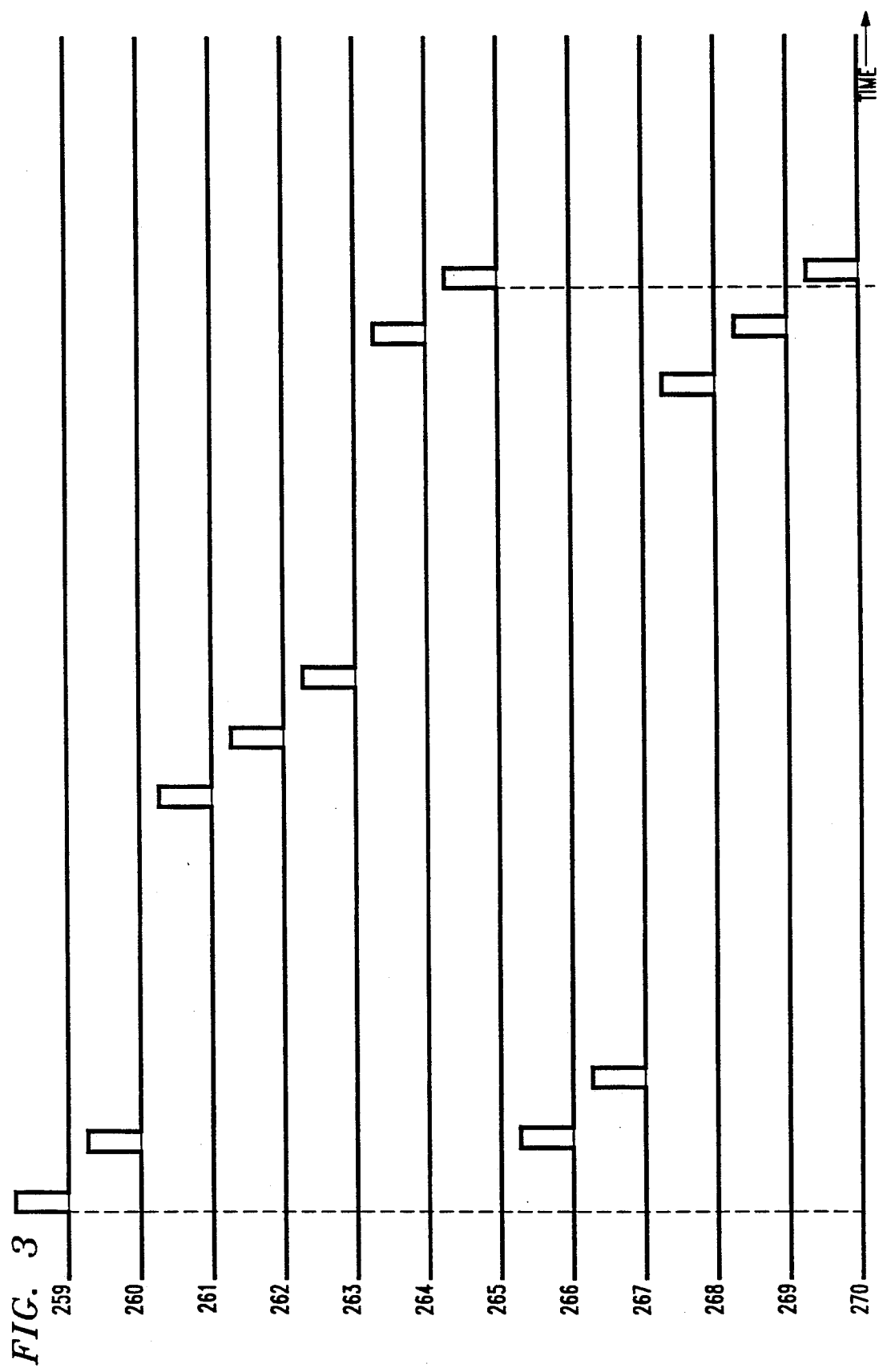

MATCHING THE CLOCK PHASE OF DUPLICATED CLOCK CIRCUITS

TECHNICAL FIELD

This invention relates to clock systems, and, in particular, to matching the phase of clock signals generated by two clock circuits.

BACKGROUND OF THE INVENTION

A prior art clock system such as those used in digital cross-connect systems (DCS) is shown in FIG. 1 which illustrates clock circuits 120 and 121. One clock circuit is in an active mode whereas the other clock circuit is in a standby mode. Clock controllers 101 and 111 communicate via cable 110 and determine which clock circuit is active. If clock circuit 120 is active, then it drives clock buses 108 and 118 by the clock signals generated by phase locked loop 102. Clock controller 111 controls gates 115, 116, 117 so that the clock information on cable 109 is used to drive clock bus 118. Phase locked loop 112 utilizes the information received via cable 109 to align itself both in frequency and in phase with the output of phase locked loop 102.

In order to synchronize approximately the phases between clock buses 108 and 118, the output of phase locked loop 102 to bus 108 is delayed by delay line 104 to compensate for the nominal delay through gate 103, gate 117, and cable 109 to bus 118. When clock circuit 121 is active, similar functions are performed. However, there are problems with using a delay line to compensate for the delays through the semiconductor devices such as gates 103, 106, and 117. First, semiconductor devices have widely varying propagation delay times when the devices are not in the same physical package. Further, delay lines can not be temperature compensated for propagation delay shifts in the semiconductor devices, cables and within the delay line itself. Further, delay lines are notoriously unreliable devices.

The use of clock circuits such as clock circuits 120 and 121 has lead to severe limitations on duplicated digital switching systems. These limitations include having to place the clock circuits in very close proximity to each other and, in certain cases, within the same equipment shelf.

In addition, the use of such a clock system leads to the limitation on the architecture of the duplicated digital switching systems. This clock system normally allows error free switching between duplicated data signals only at relatively low speed interfaces which normally occur at the input and the output of the digital switching systems; but this clock system does not allow error free duplication switching in the high speed portions of the duplicated digital systems. This places a limitation on the switching architectures particularly in making digital switching systems more reliable. In addition, when the digital switching systems are switching high speed data at the inputs and the outputs, it is required to use high speed buffers at the input in order to compensate for the skew in clock signals from the duplicated clock circuits. The use of these high speed buffers at the inputs adds to the cost, power, and delay in such systems.

The problem is to provide duplicated clock signals matched in phase to within a few nanoseconds even when separated by hundreds of meters.

SUMMARY OF THE INVENTION

The foregoing problems are solved, and a technical advance is achieved in accordance with the principles of this invention incorporated in a method and apparatus for communicating clock signals from an active clock circuit to its local timing bus via a first path that is through a standby clock circuit, two transmission links interconnecting the clock circuits, and the active clock circuit. The active clock circuit communicates clock signals to the remote timing bus via a second path that is through the active clock circuit, a transmission link that is approximately twice as long as each of the other two transmission links, and the standby clock circuit. Commercially available transceivers are used in the first and second paths within the two clock circuits. To assure that delays due to propagation time variations of the transceivers remain the same for both paths, an equal number of transceivers in each clock circuit is used in each path. Further, to reduce propagation variations due temperature change and doping levels, the transceivers in each path are on the same monolithic substrate of an intergrated circuit in each clock circuit. To reduce the delay variations within the transmission links due to temperature differences, the links are positioned physically close to each other so as to experience the same temperature. In case, it becomes necessary for the standby clock to become active, the standby clock circuit uses clock signals transmitted to the remote bus (which is local to the standby clock circuit) to adjust the phase of clock signals generated by the standby clock circuit to match the phase of clock signals generated by the active clock circuit.

Other and further aspects of the present invention will become apparent during the course of the following description and by reference to the accompanying drawing.

BRIEF DESCRIPTION OF THE DRAWING

FIG. 3 illustrates a timing diagram for the clock system of FIG. 2.

DETAILED DESCRIPTION

Figure 1:
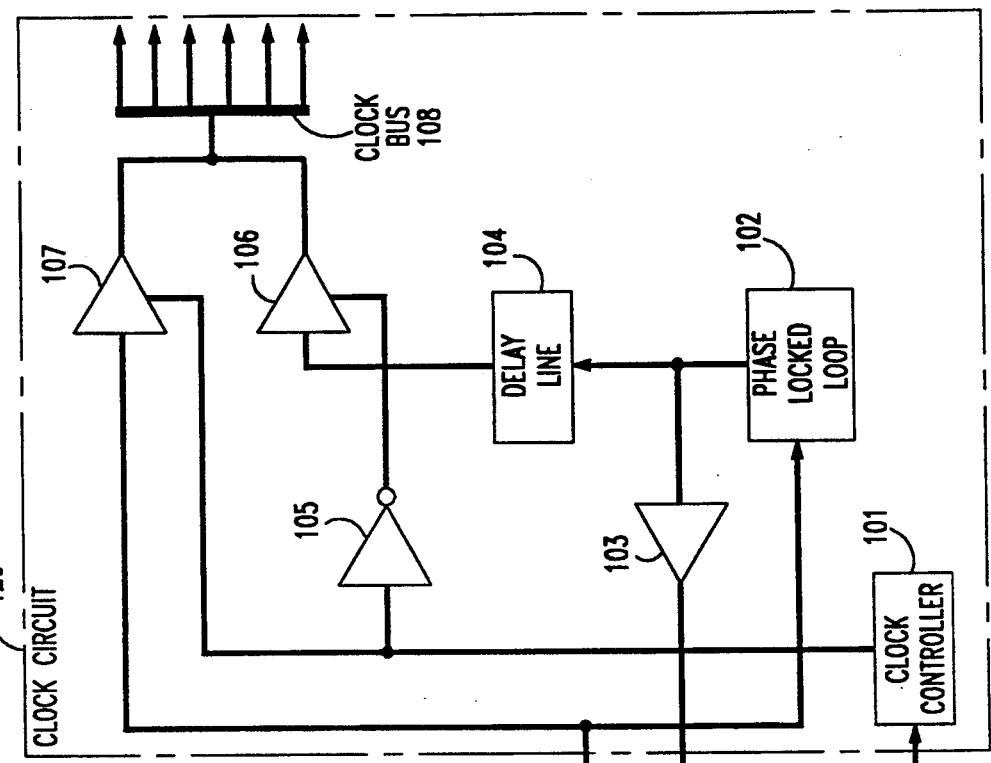
FIG. 1 illustrates, in block diagram form, a prior art clock system for matching the phase of clock signals generated by two clock circuits.
Figure 1:
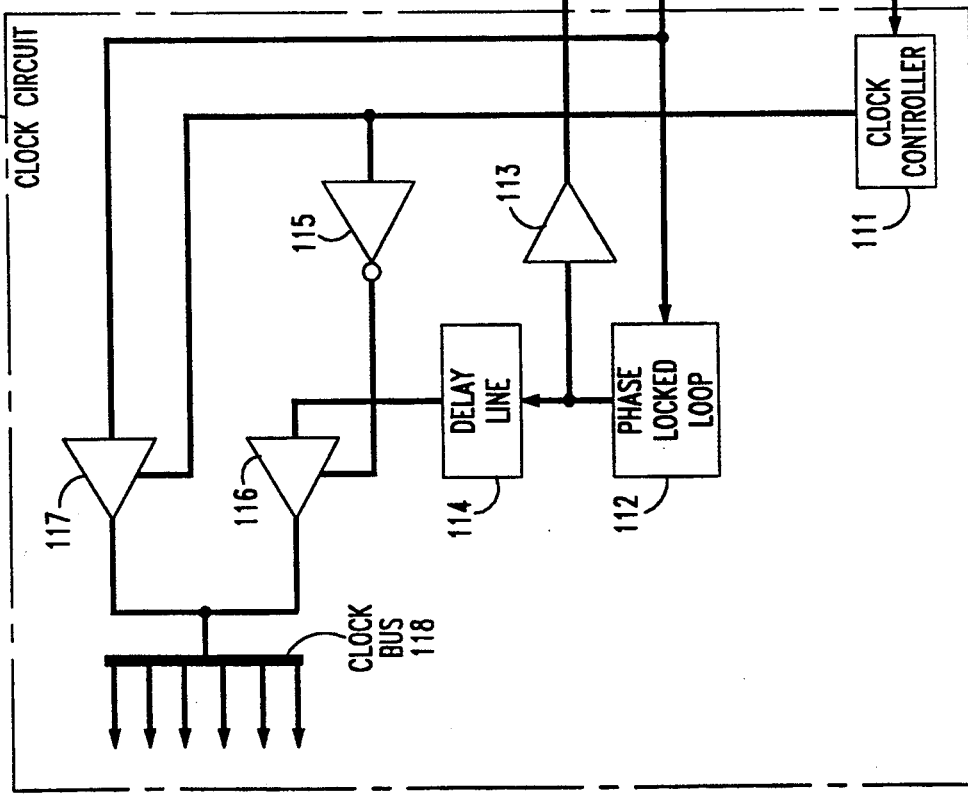
Figure 2:
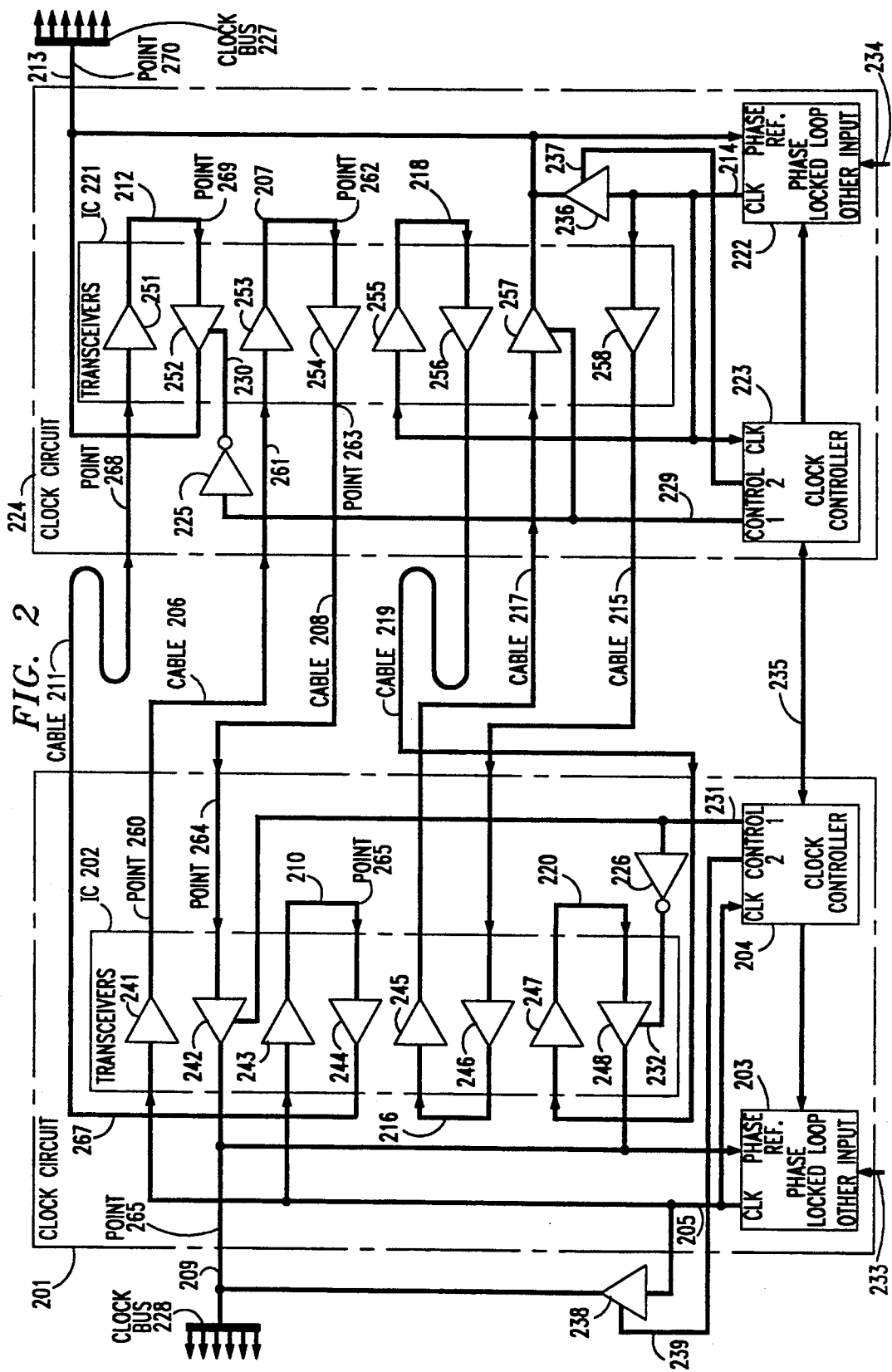
FIG. 2 illustrates a clock system in accordance with the invention.

FIG. 2 illustrates an embodiment of the present invention. Clock circuits 201 and 224 each have intergrated circuits 202 and 221, phase locked loops 203 and 222, and clock controllers 204 and 223, respectively. Intergrated circuits 202 and 221 each have transceivers which are intergrated circuit devices packaged on the same monolithic substrate. This eliminates the considerable variation in speeds in the semiconductor process by guaranteeing that all devices have the same doping levels. Even though intergrated circuits 202 and 221 may not be matched to each other with respect to propagation delay, it will subsequently be described how equal numbers of transceivers in each intergrated circuit are placed in each transmission path to cancel this effect. Inability to control doping levels precisely in such devices within different intergated circuits often results in speed variations over a factor of three or more in those devices. In accordance with the invention, each duplicated clock signal travels through an equivalent number of transceivers in each monolithic package. In addition, for each transceiver traveled through in one clock signal path, the duplicated clock signal travels through the corresponding transceivers in the other clock signal path.

Each clock signal is further guaranteed to travel through the same time delay in the interconnecting cables. This is done by measuring the transit delay of the clock signals for the clock buses and adjusting the cable length to exactly match the delays through the two paths. The cable delay of the path which is twice as long as the others is shortened somewhat to compensate for the additional cable loss and dispersion expected in this path.

Clock controllers 223 and 204 communicate with each other in such a way that in a steady state condition one clock circuit is the active clock circuit and is providing the clock signals for clock bus 227 and clock bus 228. Phase locked loops 203 and 222 generate the clock signals. The phase locked loop of the active clock circuit which is providing clock signals for the clock buses receives its input from an oscillator or external reference, and the phase locked loop which is not providing clock for the buses uses the clock signals from the other clock circuit as its input and adjusts the phase of its output to closely match the phase of the input. Phase locked loops which have the required phase build-out capabilities to perform this phase matching are disclosed in U.S. Pat. Nos. 4,651,203 and 4,672,299.

The phase matching capabilities of the circuits illustrated in FIG. 2 will become apparent by tracing a clock signal provided by phase locked loop 203 to clock buses 227 and 228. In accordance with invention, the clock signal is communicated from phase locked loop 203 to clock bus 228 via two transceivers from intergrated circuits 202 of clock circuit circuit 201, two transceivers from intergrated circuit 221 of clock circuit 224, and a total cable length of 2L (cables 206 and 208) where L is the distance between the clock circuits. The transceivers in intergated circuits 202 and 221 have tri-state outputs; however if enable conductor is not shown for a particular transceiver, that transceiver is enabled but the enable conductor is not shown for example transceiver 241. Also, in accordance with the invention, the clock signal is communicated from phase locked loop 203 to clock bus 227 via two transceivers from intergrated circuit 202, two transceivers from intergrated circuit 221, and a total cable length of approximately 2L (cable 211). Further, in accordance with invention, cables 206, 208, and 211 are physically bundled together for temperature compensation.

Consider the example when clock circuit 201 is the active clock circuit and clock circuit 224 is the standby clock circuit. Phase locked loop 203 is the signal source for both clock buses and transmits a clock signal on conductor 205. The clock signal on conductor 205 is distributed to transceivers 241 and 243. First, examine the path which provides the clock signal to bus 228. Transceiver 241 transmits the clock signal to clock circuit 224 via cable 206 having length L where L is the distance between the two clock circuits. This signal is received by transceiver 253 in clock circuit 224 and is communicated via conductor 207 to transceiver 254. Transceiver 254 retransmits the clock signal back to clock circuit 201 via cable 208 also of length L to transceiver 242 in clock circuit 201. Transceiver 242, which is enabled by clock controller 204 via conductor 231, communicates the clock signal via conductor 209 to clock bus 228. In summary, the clock signals are communicated from phase locked loop 203 to clock bus 228 via two transceivers from intergrated circuit 202 of clock circuit circuit 201, two transceivers from intergrated circuit 221 of clock circuit 224, and a total cable length of 2L (cables 206 and 208).

Next examine the path which provides clock signals from phase locked loop 203 to clock bus 227. A clock signal is received over conductor 205 by transceiver 243 of clock circuit 201 and is communicated by transceiver 243 via conductor 210 to transceiver 244. Transceiver 244 transmits the clock signal via cable 211 to transceiver 251 of clock circuit 224. Conductor 211 has a length of approximately 2L for delay compensation. Cable 211 is shown to have a loop of the appropriate length, such a loop is packaged to keep all portions of the loop in close proximity with the rest of cable 211 and with cables 206 and 208 so that all experience the same temperature. The looped portion of cable 211 does not exactly duplicate the temperature environments of cables 206 and 208 because it could not traverse the entire length of such routes. However, in switching office environments the temperature is generally quite constant.

In response to the clock signal from transceiver 244, transceiver 251 communicates the clock signal via conductor 212 to transceiver 252 which is enabled by clock controller 223 via conductor 229, transceiver 225, and conductor 230 to communicate the clock signal to clock bus 227 over conductor 213. The path has been compensated by using equivalent length cables; and in each path, the clock signal encounters an equivalent number of transceivers in intergrated circuits 202 and 221. Further, each signal encounters transceivers 241 through 244 and transceivers 251 through 254 exactly once. Since transceivers 241 through 244 are monolithic devices in the same intergrated circuit their delays are very similar and all devices are approximately at the same temperature since the devices are all in the same package. Similarly, transceivers 251 through 254 are monolithic devices in the same intergrated circuit and their delays are very closely matched and they are approximately at the same temperature since they are all in the same package.

When clock circuit 224 is the active clock circuit, the clock signal is provided initially over conductor 214 and transceivers of intergrated circuits 202 and 221 and cables 219, 217, and 215 are used in a similar manner as described with respect to clock circuit 201.

Clock controllers 204 and 223 switch between the duplicated clock signals by examining the phase of clock signals over conductors 205 and 214, respectively, and performing the switch via control signals communicated via conductors 231 and 229, respectively. Since the phase locked loop of the standby clock circuit closely tracks the phase of the phase locked loop of the active clock circuit, no phase disruption is experienced when switching from one clock circuit to the other. In addition, some fixed phase delay is provided between the clock signals and the time when the switch-over occurs to make sure that the switch-over does not interfere with active clock signals provided to clock buses 227 and 228. Circuitry for providing this function is well known in the art. Inverters 226 and 225 are included so that only one transceiver is actively driving clock buses 228 and 227 at a time. Although integrated circuits 202 and 221 are illustrated as having noninverting devices, inverting devices may be used with no change in the circuitry.

Additionally, tri-state gates 236 and 238 are added so that the clock circuits can provide local clock signals in the cases in which signal transmission through the interconnecting cables is interrupted due to maintenance or failure conditions. In the case, when clock bus 228 cannot be driven via clock circuit 224, clock controller 204 detects this condition by detecting a loss of clock signals from clock circuit 224 and enables gate 238 by means of conductor 239 to communicate the clock signals on conductor 205 from phase locked loop 203 onto clock bus 228. Similarly, in the case when clock bus 227 cannot be driven by normal means, clock controller 223 enables gate 236 by means of conductor 237 to communicate the clock signals via conductor 214 from phase locked loop 222 onto clock bus 227.

The invention is not limited to the use of electrical devices. Those skilled in the art could readily use optical transmitter and receiver arrays in place of the electrical intergrated circuits 202 and 221, and optical cables could be substituted for their electrical counterparts. Further, the use of the distribution portion of the present invention applies equally to data signals which must be matched in phase between portions of a system.

FIG. 3 shows a timing diagram that illustrates signals for points 259 through 270 of FIG. 2 for one clock cycle. For convenience, lines of FIG. 3 use the notation of the points. It is shown that the clock signals of lines 265 and 270, the signals corresponding to the clock buses 227 and 228 of FIG. 2, differ by a small amount caused only be subtle third order effects in the distribution of clock signals. The analysis of lines 259 through 270 assumes that the delays through the transceivers and their associated short conductors is much less than the corresponding delays through the interconnecting cables.

In accordance with the invention, all first order effects such as semiconductor process variations and cable lengths are compensated. Further, second order effects such as temperature variations in cables and impedance mismatched in interconnecting individual devices within packages are compensated.

I claim:

1. Apparatus for adjusting phase of signals on two signal buses with each bus physically located with one of two clock sources and an active one of the clock sources supplying the signals to both signal buses, comprising:
   first means for communicating signals from the active clock source to the signal bus located with the active clock source via a first set of communication devices located in the active clock source, a second set of communication devices located in a standby clock source, and a communication link between the two clock sources; and
   second means for communicating signals from the active clock source to the signal bus located with the standby clock source via the first set of communication devices, the second set of communication devices, and the communication link between the two clock sources where the number of communication devices in each of the sets of communication devices is equal.

2. The apparatus of claim 1 where the active clock source further comprises a signal generator to produce the signals and the first means comprises a first path for communicating the signals from the signal generator to a first one of the first set of communication devices;
   a first one of the second set of communication devices interconnected to the output of the first one of the first set of communication devices via a first sublink in the communication link;
   a second path from the output of the first one of the second set of communication devices to a second one of the second set of communication devices;
   a second one of the first set of communication devices interconnected to the output of the second one of the second set of communication devices via a second sublink in the communication link; and
   third path for communicating the output of the second one of the first set of communication devices to the signal bus located with the active clock source.

3. The apparatus of claim 2 where first path further communicates the signals from the signal generator to a third one of the first set of communication devices;
   the second means further comprises a fourth path for communicating the output of the third one of the first set of communication devices to a fourth one of the first set of communication devices;
   a third one of the second set of communication devices interconnected to the output of the third one of the first set of communication devices via a third sublink in the communication link where the third sublink is approximately equal in length to the sum of the first and second sublinks;
   the fourth one of the second set of communication devices interconnected to the output of the third one of the second set of communication devices via a fifth path;
   sixth path from the output of the fourth one of the second set of communication devices to the signal bus located with the standby clock source.

4. The apparatus of claim 3 where the first set of communication devices is part of a monolithic substrate and the second set of communication devices is part of another monolithic substrate.

5. The apparatus of claim 3 where the communication link is a bundle of cables and the first, second, and third sublinks are cables and the cables of the cable bundle are in close physical proximity.

6. The apparatus of claim 5 where the signals are clock signals.

7. The apparatus of claim 5 where the standby clock source comprises another signal generator and the other signal generator responsive to the signals communicated to the signal bus located with the standby clock source for adjusting other signals generated by the other signal generator to match the phase of the communicated signals.

8. The apparatus of claim 7 where the standby clock source further comprises means responsive to the absence of the communicated signals for supplying the signal bus located with the standby clock source with the other signals generated by the other signal generator.

9. A method for adjusting phase of signals on two signal buses each bus physically located with one of two clock sources and an active one of the clock sources supplying the signals to both signal buses, the method comprising the steps of:
   communicating signals from the active clock source to the signal bus located with the active clock source via a first set of communication devices located in the active clock source, a second set of communication devices located with a standby clock source, and a communication link between the two clock sources; and communicating signals from the active clock source to the signal bus located with the standby clock source via the first set of communication devices, the second set of communication devices, and the communication link between the two clock sources where the number of communication devices in each of the sets of communication devices is equal.

* * * * *